US005781081A

United States Patent [19]

Arakawa et al.

[11] Patent Number: 5,781,081

[45] Date of Patent: Jul. 14, 1998

[54] LC-TYPE DIELECTRIC FILTER HAVING AN INDUCTOR ON THE OUTERMOST LAYER AND FREQUENCY ADJUSTING METHOD THEREFOR

[75] Inventors: Michiya Arakawa; Tatsuya Takemura, both of Kani; Kazumasa Koike, Konan; Hideaki Tanaka, Gifu, all of Japan

[73] Assignee: NGK Spark Plug Co., Ltd., Nagoya, Japan

[21] Appl. No.: 703,946

[22] Filed: Aug. 28, 1996

[30] Foreign Application Priority Data

| | | | |
|---|---|---|---|
| Sep. 1, 1995 | [JP] | Japan | 7-248854 |
| Oct. 12, 1995 | [JP] | Japan | 7-292036 |

[51] Int. Cl.$^6$ .......... H03H 7/01

[52] U.S. Cl. .......... 333/185; 333/175

[58] Field of Search .......... 333/184, 185, 333/175

[56] References Cited

U.S. PATENT DOCUMENTS

| | | | |
|---|---|---|---|
| 3,947,934 | 4/1976 | Olson | 333/184 |
| 4,157,517 | 6/1979 | Kneisel et al. | 333/205 |
| 4,963,843 | 10/1990 | Peckham | 333/203 |
| 5,023,578 | 6/1991 | Kaneko et al. | 333/185 |
| 5,404,118 | 4/1995 | Okamura et al. | 333/175 |
| 5,523,729 | 6/1996 | Nakai et al. | 333/185 X |

FOREIGN PATENT DOCUMENTS

| | | | |
|---|---|---|---|
| 5-82344 | 4/1993 | Japan | 333/185 |
| 6-56813 | 7/1994 | Japan . | |

*Primary Examiner*—Robert Pascal
*Assistant Examiner*—Justin P. Bettendorf
*Attorney, Agent, or Firm*—Foley & Lardner

[57] ABSTRACT

In an LC-type dielectric filter, an inductor is formed on the uppermost or outermost insulation or dielectric layer and electrically connected at the opposite ends thereof to an upper electrode and a lower electrode which cooperate with a thin film dielectric layer to constitute a capacitor, by means of conductive vias. A method of adjusting a frequency of an LC-type filter is also provided. By the method, an optimum inductance for an inductor is calculated based on a measured capacitance and a desired frequency of the filter, and a pattern of the inductor which is capable of attaining the optimum inductance is selected from a group of predetermined patterns which differ in inductance. The inductor is formed on the outermost dielectric layer in such a manner as to have the selected pattern.

7 Claims, 5 Drawing Sheets

LC-TYPE DIELECTRIC FILTER HAVING AN INDUCTOR ON THE OUTERMOST LAYER AND FREQUENCY ADJUSTING METHOD THEREFOR

BACKGROUND OF THE INVENTION

1. Field of the Invention

The present invention relates to an LC-type dielectric filter for use in radiocommunication devices such as a portable telephone, automotive telephone, or the like. Furthermore, the present invention relates to a method of adjusting a resonant frequency of the LC-type dielectric filter.

2. Description of the Related Art

An LC-type dielectric filter of the kind including a single or plurality of thin insulation substrates such as alumina substrates or the like, and a parallel resonant circuit carried by the substrates and consisting of a resonant capacitor and an inductor which are connected in parallel, is generally used. The term "LC-type dielectric filter" is herein used to indicate a dielectric filter which is constituted by a thin film capacitor and an inductor. The LC-type dielectric filter is being favorably and increasingly employed in a card-sized portable telephone since it can be made thin and small-sized more easily as compared with an integral type dielectric filter and a three-conductor type strip-line filter having two dielectric substrates between which a resonant conductor in the form of a thin film is interposed.

On the other hand, demand for electronic devices or the like which are smaller in size, higher in performance ability and more dense in arrangement of parts or elements has become increasingly higher in recent years, so it has been desired more strongly to make the LC-type dielectric filter smaller in size. To meet with this demand, it is necessary to make the filter elements more integrated and smaller in size. From such a demand, it has been proposed to make thinner an LC-type dielectric filter by placing a thin film dielectric layer or the like upon an insulation substrate.

In this connection, a prior art LC-type dielectric filter will be described with reference to FIG. 4.

On an insulation substrate 20, rectangular lower electrodes 21*a* and 21*b* and parallel resonant inductors 22*a* and 22*b* are formed. The lower electrodes 21*a* and 21*b* are disposed in parallel to each other. The parallel resonant inductors 22*a* and 22*b* are in the form of a strip or band elongated lengthwise of the rectangular substrate 20 and connected to the lower electrodes 21*a* and 21*b*, respectively. On the insulation substrate 20, a thin film dielectric layer 27 is formed in such a manner as to cover the lower electrode layers 21*a* and 21*b* and the inductors 22*a* and 22*b*. On the dielectric layer 27 and at side surface portions thereof standing opposite the lower electrode layers 21*a* and 21*b*, upper electrode layers 28*a* and 28*b* are formed. The upper electrodes 28*a* and 28*b* have connecting end portions 29 and 29 protruding widthwise of the insulation substrate 20. The connecting end portions 29 and 29 are electrically connected to the parallel resonant inductors 22*a* and 22*b* by means of conductive vias passing through the dielectric layer 27. Further on the dielectric layer 27, junction terminals 30 and 30 are formed in such a manner as to be positioned outside of the upper electrodes 28*a* and 28*b*. The lower electrodes 21*a* and 21*b* and the upper electrodes 28*a* and 28*b* stand opposite each other by interposing therebetween the dielectric layer 27, to form parallel resonant capacitors $C_0$ and $C_0$ (refer to FIG. 6).

Further, on the dielectric layer 27, a thin film dielectric layer 31 is formed in such a manner as to cover one side surface thereof entirely, i.e., in such a manner as to cover the above described upper electrodes 28*a* and 28*b* and the junction terminals 30 and 30. On the dielectric layer 31, an input/output electrode 32*a*, a capacitor 32*c* and an input/output electrode 32*b* are formed in such a manner as to be positioned above the upper electrodes 28*a* and 28*b* and to be arranged in a line extending lengthwise of the substrate 20. The input/output electrode 32*a* stands opposite the upper electrode 28*a* by interposing therebetween the dielectric layer 31, to constitute an input/output coupling capacitor $C_1$ (refer to FIG. 6). The input/output electrode 32*b* stands opposite the upper electrode 28*b* by interposing therebetween the above described dielectric layer 31, to constitute an input/output coupling capacitor $C_2$ (refer to FIG. 6). Further, the capacitor electrode 32*c* is positioned above the upper electrodes 28*a* and 28*b* so as to stand opposite both of the same, to constitute an inter-section coupling capacitor $C_3$ (refer to FIG. 6). Further, on the dielectric layer 31 and on the opposite sides thereof, earth electrodes 34*a* and 34*b* are disposed in such a manner as to stand opposite the junction terminals 30 and 30, respectively. The input/output electrodes 32*a* and 32*b* are connected with an external wiring, and the earth electrodes 34*a* and 34*b* are connected to ground, to constitute an equivalent circuit shown in FIG. 6.

In the meantime, in the above described prior art structure, it has been practiced to make adjustment of the resonant frequency by forming a trimming hole "x" extending through the dielectric layer 31 and thereby partially removing the upper electrodes 28*a* and 28*b* of the parallel resonant capacitors $C_0$ and $C_0$ as shown in FIG. 5 and also described in Japanese patent publication (kokoku) No. 6-56813. Such frequency adjustment has a problem that the working efficiency is low, furthermore by the work for drilling such a trimming hole a crack or cracks are liable to be caused in the dielectric layer and insulation substrate assembly, etc., and the strength of the dielectric layer and insulation substrate assembly is lowered.

SUMMARY OF THE INVENTION

According to an aspect of the present invention, there is provided an LC-type dielectric filter which comprises an insulation substrate, a lower electrode doubling as an earth electrode, formed on the insulation substrate, a first dielectric layer formed on the lower electrode and the insulation substrate in such a manner as to cover a side surface of the insulation substrate on which the lower electrode is formed, substantially entirely, an upper electrode formed on the first dielectric layer in such a manner as to stand opposite the lower electrode, the lower electrode, the upper electrode and a portion of the first dielectric layer interposed between the lower electrode and the upper electrode cooperating with each other to constitute a resonant capacitor, a second dielectric layer formed on the upper electrode and the first dielectric layer in such a manner as to cover a side surface of the first dielectric layer on which the upper electrode is formed, substantially entirely, a resonant inductor formed on the second dielectric layer at a predetermined side surface area thereof, first electrical connection means for connecting one of opposite end portions of the resonant inductor to the lower electrode, and second electrical connection means for connecting the other of the opposite end portions of the resonant inductor to the upper electrode.

In this instance, the LC-type dielectric filter resonates at the frequency $f_0$ which is determined by the following expression on the basis of the capacitance C of the resonant capacitor and the inductance L of the inductor.

$$f_0 \approx 1/\{2\pi(LC)^{1/2}\}$$

The capacitance C of the resonant capacitor is determined by the dielectric constant, the thickness of the dielectric layer and an area with which the upper and lower electrodes stand opposite each other, and the inductance L of the inductor is determined by the conductive length and conductive width.

In the meantime, in the above described structure, the inductors can be attached to the inductor forming areas at the last or final stage of the process of forming the LC-type dielectric filter. Due to this, even if a variation of the capacitance of the capacitor occurs, the inductor having an optimum inductance can be formed at the inductor forming area since the resonant frequency $f_0$ is obtained by the above expression on the basis of the capacitance of the resonant capacitor and the inductance of the inductor and therefore the optimum inductance can be determined in accordance with a variation of the capacitance, whereby a desired resonant frequency $f_0$ can be obtained.

According to another aspect of the present invention, there is provided a method of adjusting a frequency of an LC-type dielectric filter. By this method, the inductor is formed in the following manner. That is, the inductor forming areas are previously secured on the dielectric layer and between the resonant capacitors, the capacitance of the resonant capacitor is measured or detected and an optimum inductance for the inductor is determined, thereafter a pattern for the inductor is selected from a plurality of predetermined patterns which differ in inductance on the basis of the optimum inductance, and the inductor is formed on the inductor forming area. That is, the inductance of the inductor varies depending upon a variation of the conductive length, conductive width, shape, etc. Thus, by selecting a suitable pattern from a group of patterns having different shapes and different predetermined inductance values, for forming the inductor on the basis of the selected pattern, a desired resonant frequency can be obtained. Further, even after formation of the inductor, the resonant frequency can be adjusted with ease by partially cutting the inductor or attaching a conductive material thereto.

The above structure and method are effective for overcoming the above noted problems inherent in the prior art device and method.

It is accordingly an object of the present invention to provide a novel and improved LC-type dielectric filter which is free from a problem inherent in the prior art device, i.e., a problem that it is liable to have a crack or cracks and be lowered in mechanical strength at the time of adjustment of a resonant frequency.

It is a further object of the present invention to provide a novel and improved LC-type dielectric filter of the above described character which can adjust its resonant frequency with ease and without the necessity of a trimming hole.

It is a further object of the present invention to provide a method of adjusting a resonant frequency of an LC-type dielectric filter which can adjust the frequency thereof with ease and without the necessity of a trimming hole.

DETAILED DESCRIPTION OF THE PREFERRED EMBODIMENTS

Figure 1:
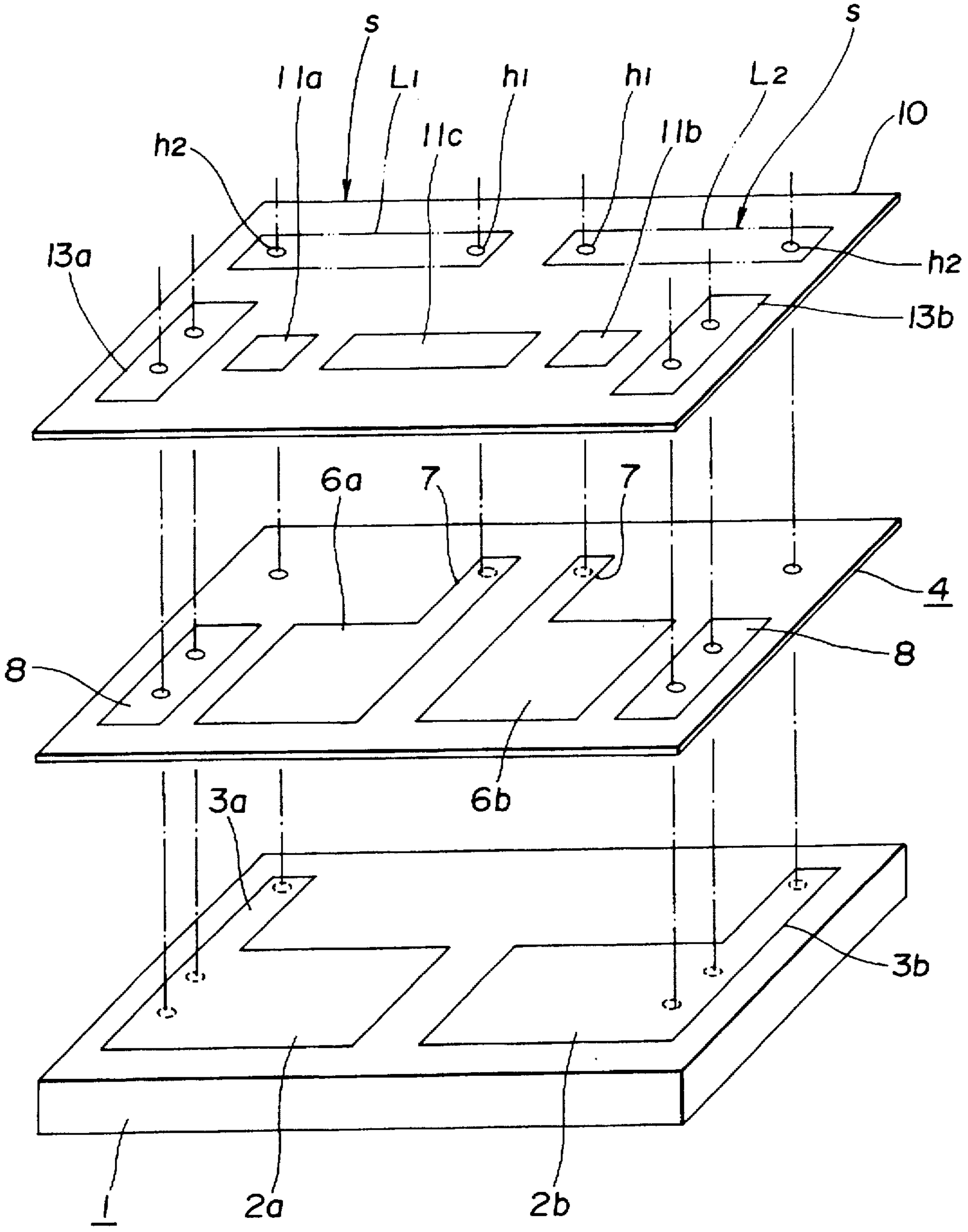
FIG. 1 is an exploded view of an LC-type dielectric filter according to an embodiment of the present invention.
Figure 2:
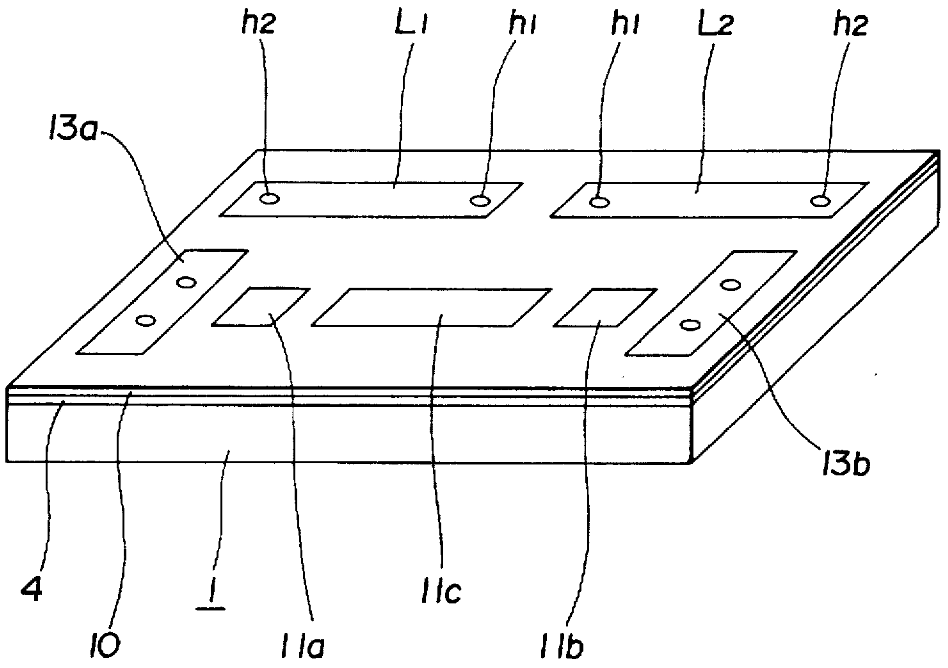
FIG. 2 is a perspective view of the LC-type dielectric filter of FIG. 1.

Referring first to FIGS. 1 to 3 and 6, an LC-type dielectric filter according to an embodiment of the present invention is shown as including a thin insulation substrate 1 which is 0.635 mm thick, 2 mm long and 2 mm wide and made of a ceramic material mainly containing alumina or the like. The insulation substrate 1 is adapted to carry thereon a parallel resonant circuit consisting of a resonant capacitor $C_0$ and an inductor L shown in FIG. 6.

On the insulation substrate 1, lower electrodes 2*a* and 2*b* doubling as earth electrodes are formed so as to be positioned side by side and along the length of the substrate 1, and located nearer to one of the opposite sides relative to the width of the substrate 1. Each of the lower electrodes 2*a* and 2*b* is constituted by a plating layer of a Fe-Ni alloy which is formed directly or by way of a base layer on the insulation substrate 1. Specifically, the plating layer of a Fe-Ni alloy is formed by first forming a Fe plating layer and a Ni plating layer, separately and then heating the plating layers to constitute a single plating layer of a Fe-Ni alloy. The lower electrodes 2*a* and 2*b* are adapted to serve as lower electrodes of resonant capacitors $C_0$ and $C_0$ (refer to FIG. 6).

On one side of the insulation substrate 1, a thin film insulation or dielectric layer 4 made of $SiO_2$ is placed so as to cover the entire side thereof and therefore the lower electrodes 2*a* and 2*b*. On the dielectric layer 4 and at side surface portions thereof standing opposite to the lower electrodes 2*a* and 2*b*, upper electrodes 6*a* and 6*b* are formed by sputtering. The upper electrodes 6*a* and 6*b* are extended widthwise of the substrate 1 to have connecting end portions 7 and 7. Further, on the dielectric layer 4 and at side surface portions thereof outside the upper electrodes 6*a* and 6*b*, junction terminals 8 and 8 are formed by sputtering. Thus, the lower electrodes 2*a* and 2*b* and the upper electrodes 6*a* and 6*b* stand opposite each other by interposing therebetween the above described dielectric layer 4, whereby to constitute parallel resonant capacitors $C_0$ and $C_0$ (refer to FIG. 6).

Further, on the dielectric layer 4, a thin film insulation or dielectric layer 10 made of $SiO_2$ or polyimide resin is placed so as to cover one side surface thereof substantially entirely and therefore the above described upper electrodes 6*a* and 6*b* and the junction terminals 8 and 8. On the dielectric layer 10 and at a side surface portion thereof adjacent one of opposite ends opposing widthwise of the substrate 1, a pair of parallel resonant inductors $L_1$ and $L_2$ are formed. The parallel resonant inductors $L_1$ and $L_2$ are electrically connected at inner ends to the connecting end portions 7 and 7 of the upper electrodes 6*a* and 6*b* by way of conductive vias $h_1$ and $h_1$ passing through the dielectric layer 10 and at outer ends to the connecting end portions 3*a* and 3*b* of the lower electrodes 2*a* and 2*b* by way of conductive vias $h_2$ and $h_2$ passing through the dielectric layers 10 and 4, respectively. The term "conductive via" is herein used to indicate an electrical connection means comprised of a via hole filled with or plated with a conductive metal such as Ag, Au, Al and Cu. Further, on the dielectric layer 10 and above the upper electrodes 6*a* and 6*b*, an input/output electrode 11*a*, a capacitor electrode 11*c* and an input/output electrode 11*b* are formed in such a manner as to be arranged in a line extending widthwise of the substrate 1. The input/output electrode 11*a* stands opposite the upper electrode 6*a* by interposing therebetween the dielectric layer 10 to constitute an input/output coupling capacitor $C_1$ (refer to FIG. 6). The input/output electrode 11*b* stands opposite the upper electrode 6*b* by interposing therebetween the dielectric layer 10 to constitute an input/output coupling capacitor $C_2$ (refer to FIG. 6). Further, the capacitor electrode 11*c* is arranged so as to be positioned above the upper electrodes 6*a* and 6*b* and stand opposite both of the same to constitute an inter-section coupling capacitor $C_3$ (refer to FIG. 6).

Additionally, on the dielectric layer 10 and at side surface portions at opposite ends, relative to the length of the substrate 1, a pair of earth electrodes 13*a* and 13*b* are formed by sputtering in such a manner as to stand opposite the junction terminals 8 and 8, respectively.

Figure 6:
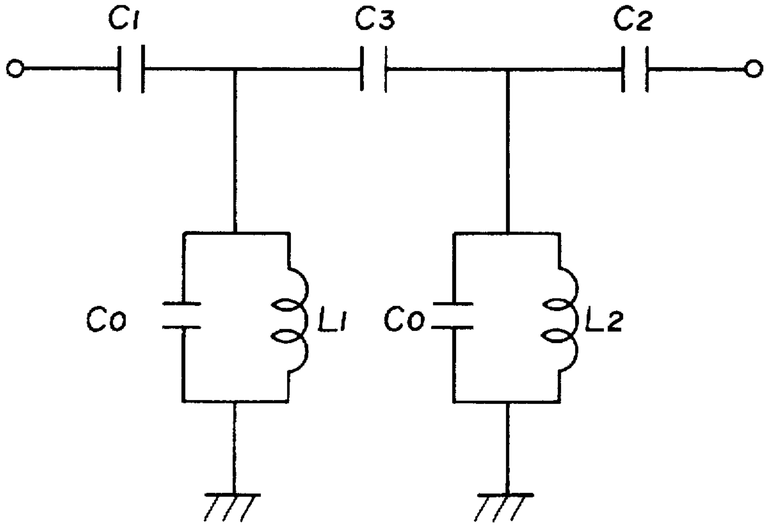
FIG. 6 is an equivalent circuit of the LC-type dielectric filter of FIG. 1 and the prior art LC-type dielectric filter of FIG. 4.

The input/output electrodes 11*a* and 11*b* are connected with an external wiring, and the earth electrodes 13*a* and 13*b* are connected to ground to constitute an equivalent circuit shown in FIG. 6.

By such a structure, it becomes possible to form the parallel resonant inductors $L_1$ and $L_2$ at the final or last stage of the process of forming the filter. So, an intermediate product which is not provided with the parallel resonant inductors $L_1$ and $L_2$ is first prepared. Then, the inductance values of the inductors $L_1$ and $L_2$ are set or determined by selecting or determining the shapes of the parallel resonant inductors $L_1$ and $L_2$. Thereafter, the parallel resonant inductors $L_1$ and $L_2$ are formed by sputtering at predetermined inductor forming areas "s", which is a last or final stage of the process of forming the filter, whereby the inductance values can be made optimum. Further, by partially removing the inductors $L_1$ and $L_2$ or attaching an additional conductive material thereto after their formation, the resonant frequency can be adjusted with ease.

That is, the capacitance C of the resonant capacitor $C_0$, the inductance L of the parallel resonant inductors $L_1$ and $L_2$ and the resonant frequency $f_0$ have a relation that is expressed by $f_0 \approx 1/\{2\pi (LC)^{1/2}\}$. So, in order to obtain a desired resonant frequency $f_0$, the capacitance C of the resonant capacitor $C_0$ is first detected by means of a capacitive detector. Then, the inductor L is determined by using the above expression and depending upon the detected capacitance C. Thereafter, the shape of the inductors $L_1$ and $L_2$, i.e., the shape of the inductor forming areas "s" is determined so that the inductors $L_1$ and $L_2$ have a predetermined inductance L, and the inductors $L_1$ and $L_2$ are formed at the inductor forming areas "s". In this connection, the inductance L of the parallel resonant inductors $L_1$ and $L_2$ varies depending upon a variation of the conducter length, conductor width, conductor shape, etc. Accordingly, by selecting a pattern for the parallel resonant inductors $L_1$ and $L_2$ from different patterns which are known to have different predetermined inductance values and using the selected pattern for the parallel resonant inductors $L_1$ and $L_2$, a desired resonant frequency $f_0$ can be obtained even if a variation of the capacitance C of the resonant capacitor $C_0$ occurs.

In this case, the predetermined pattern can be formed by indicating the pattern by using an automatic exposure device or the like, or the pattern can be selected automatically by inputting a predetermined inductance or a static capacitance of the resonant capacitor $C_0$ to a certain device, or an optimum pattern can be formed in response to the above inputting and then the pattern can be formed automatically depending upon the optimum pattern at the inductor forming areas "s". In the meantime, it can be said that in the structure for forming an optimum pattern for the inductors automatically, an infinite number of patterns can be prepared by using the above expression since the relation between the inductance and the shape of the inductor are previously determined by the expression. Such an automatic pattern forming structure can be regarded as one of the structures for selecting one of a plurality of predetermined patterns on the basis of an optimum inductance. In the meantime, it will be needless to say that the inductance (resonant frequency) can be adjusted by forming the inductors $L_1$ and $L_2$ manually, or by partially removing the inductors $L_1$ and $L_2$ or attaching an additional material thereto partially.

By the above, parallel resonant inductors having optimum inductance can be obtained and a desired resonant frequency is realized.

In this instance, the conductive vias $h_1$ and $h_2$ extending through the dielectric layer 4 and the dielectric layer 10 can be formed either prior to or after formation of the inductors $L_1$ and $L_2$.

Figure 3A:
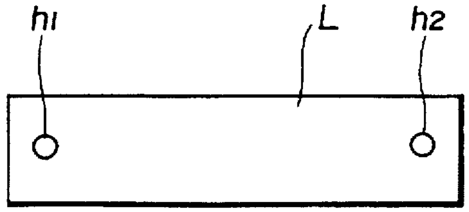
FIGS. 3A to 3C are plan views of various inductors for use in the LC-type dielectric filter of FIG. 1.
Figure 3B:
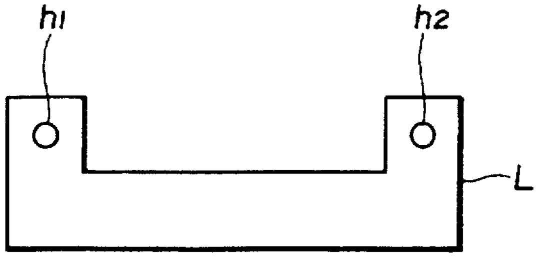
Figure 3C:
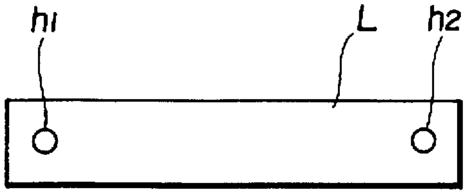
Figure 4:
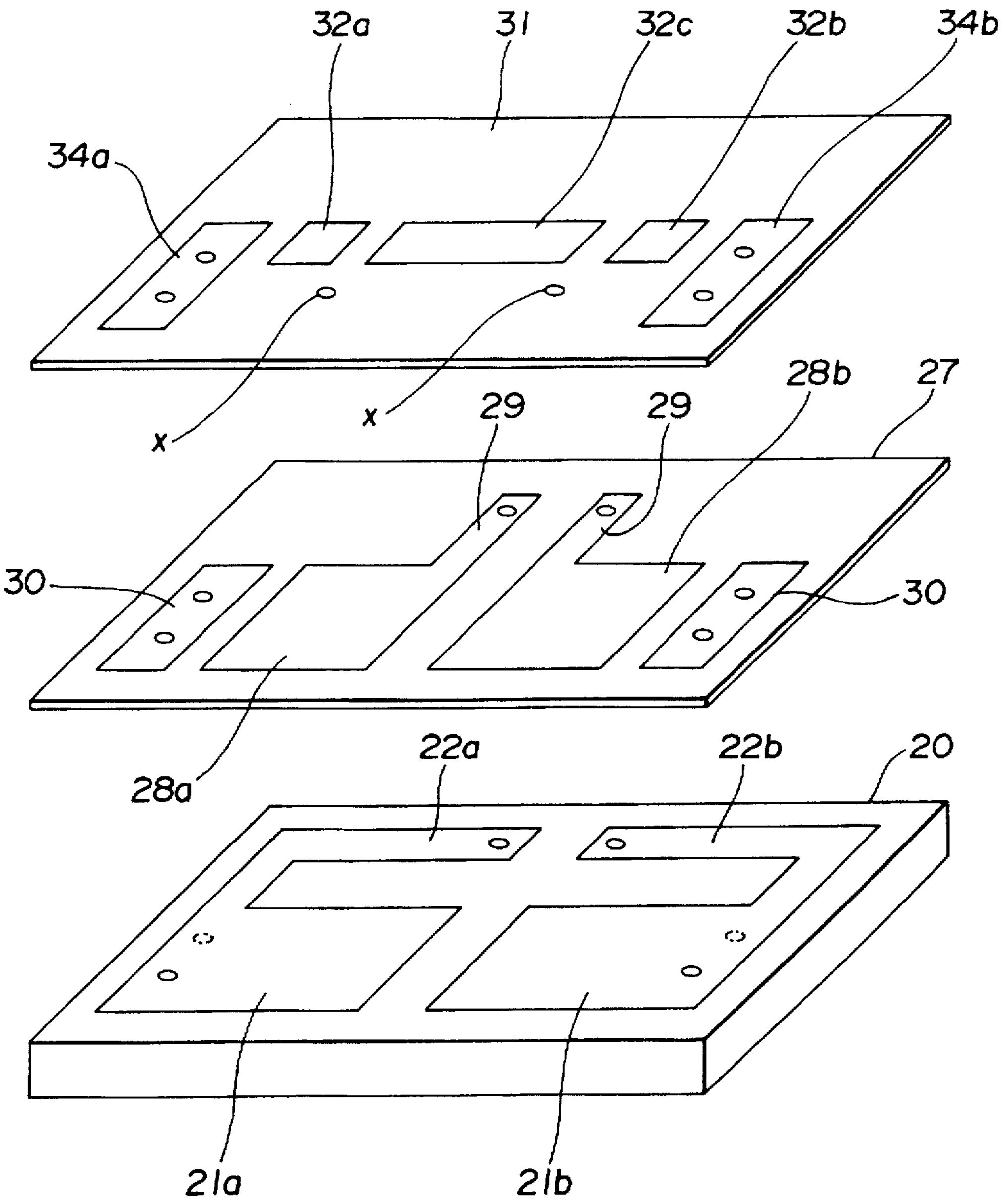
FIG.4 (PRIOR ART)
FIG. 4 is an exploded view of a prior art LC-type dielectric filter.
Figure 5:
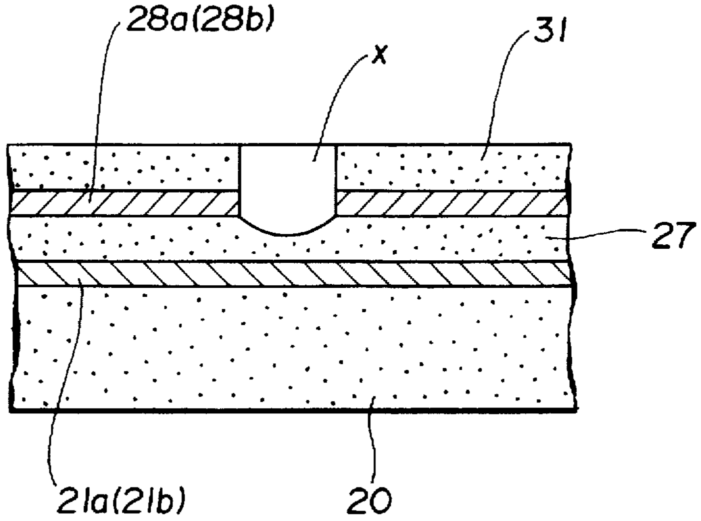
FIG.5 (PRIOR ART)
FIG. 5 is a fragmentary sectional view of the prior art LC-type dielectric filter of FIG. 4.

FIGS. 3A to 3C show various patterns for the inductor L(i.e., $L_1$ or $L_2$) which is to be formed at the inductor forming area "s". In either of the patterns, the conductive vias $h_1$ and $h_2$ are formed in the dielectric layer 10 prior to formation of the inductor L, so selection of the patterns is made in such a manner that the inductor L can be connected at opposite ends thereof to the conductive vias $h_1$ and $h_2$. The patterns shown in FIGS. 3A to 3C have different inductance values by having different widths and shapes. The patterns in FIGS. 3A to 3C are shown by way of example only and the inductance can be set variously by changing the shape variously, for example by changing the width, the shape of the bent portion, etc.

Thus, by measuring or detecting the capacitance of the resonant capacitor $C_0$, determining an optimum inductance of the inductors L by using the above described expression and on the basis of the measured capacitance C and a desired resonant frequency $f_0$, thereafter selecting a pattern of a predetermined inductance from the group of patterns, forming the inductors L at the inductor forming areas "s" by sputtering, plating or the like, and providing predetermined electrical connections to the inductors L by means of the conductive vias $h_1$ and $h_2$, a desired resonant frequency is obtained and an equivalent circuit shown in FIG. 6 is obtained.

While it has been described with reference to FIG. 1 that the dielectric layer 10 is made of a dielectric material and the input/output capacitors $C_1$ and $C_2$ and the inter-section coupling capacitor $C_3$ are formed by using the dielectric layer 10, this is not for the purpose of limitation but can be modified variously, that is, in brief any structure will do so long as an uppermost layer is an insulation or dielectric layer and has inductor forming areas "s".

An LC-type dielectric filter of this invention is constructed to have inductor forming areas "s" at the uppermost surface thereof and form parallel resonant inductors $L_1$ and $L_2$ thereat, and to connect ends of the inductors to lower electrodes of parallel resonant capacitors and other ends of the same to upper electrodes of the parallel resonant inductors, whereby attaching of the parallel resonant inductors $L_1$ and $L_2$ can be done at the last or final stage of the process of forming the filter, the inductance can be set suitably by selecting the shape of the inductors $L_1$ and $L_2$, and adjustment of the resonant frequency can be done with ease by partially removing the inductors $L_1$ and $L_2$ or by additionally attaching a conductive material thereto, even after formation of the inductors $L_1$ and $L_2$. Further, such adjustment does not require drilling of a trimming hole "x" as in the prior art structure, thus not causing any possibility of causing a crack or cracks and reducing the strength.

Further, by the inductor forming method in which a pattern is selected from a plurality of predetermined patterns on the basis of an optimum inductance and an inductor L is formed at an inductor forming area "s" in accordance with the selected pattern, a desired resonant frequency can be set by selection of the pattern and therefore quite with ease.

What is claimed is:

1. An LC-type dielectric filter comprising:

an insulation substrate;

a lower electrode doubling as an earth electrode, formed on said insulation substrate;

a first dielectric layer formed on said lower electrode and said insulation substrate in such a manner as to cover a side surface of said insulation substrate on which said lower electrode is formed, substantially entirely;

an upper electrode formed on said first dielectric layer in such a manner as to stand opposite said lower electrode;

said lower electrode, said upper electrode and a portion of said first dielectric layer interposed between said lower electrode and said upper electrode cooperating with each other to constitute a resonant capacitor;

a second dielectric layer formed on said upper electrode and said first dielectric layer in such a manner as to cover a side surface of said first dielectric layer on which said upper electrode is formed, substantially entirely;

a resonant inductor formed on said second dielectric layer at a predetermined side surface area thereof;

first electrical connection means provided through said first and second dielectric layers for electrically connecting one of opposite end portions of said resonant inductor to said lower electrode; and second electrical connection means provided through said second dielectric layer for electrically connecting the other of said opposite end portions of said resonant inductor to said upper electrode.

2. An LC-type dielectric filter comprising:

an insulation substrate;

a pair of lower electrodes doubling as earth electrodes, disposed on said insulation substrate;

a first dielectric layer disposed on said lower electrodes and said insulation substrate in such a manner as to cover a side surface of said insulation substrate on which said lower electrodes are disposed, substantially entirely;

a pair of upper electrodes disposed on said first dielectric layer in such a manner as to stand opposite said lower electrodes, respectively;

said lower electrodes, said upper electrodes and portions of said first dielectric layer interposed between said lower electrodes and said upper electrodes cooperating with each other to constitute a pair of parallel resonant capacitors, respectively;

a second dielectric layer disposed on said upper electrodes and said first dielectric layer in such a manner as to cover a side surface of said first dielectric layer on which said upper electrodes are disposed, substantially entirely;

a pair of parallel resonant inductors disposed on said second dielectric layer at predetermined side surface areas thereof and having opposite first and second end portions, respectively;

first electrical connection means provided through said first and second dielectric layers for electrically connecting said first end portions of said resonant inductors to said lower electrodes, respectively; and second electrical connection means provided through said second dielectric layers for electrically connecting said second end portions of said resonant inductors to said upper electrodes, respectively.

3. An LC-type dielectric filter comprising:

a laminated insulation layer assembly including an insulation substrate and first and second dielectric layers which are placed one upon another in such a manner that said first dielectric layer is interposed between said insulation substrate and said second dielectric layer;

a lower electrode doubling as an earth electrode, disposed between said insulation substrate and said first dielectric layer;

an upper electrode disposed between said first dielectric layer and said second dielectric layer and standing opposite said lower electrode;

said lower electrode, said upper electrode and a portion of said first dielectric layer interposed between said lower electrode and said upper electrode cooperating with each other to constitute a resonant capacitor;

a resonant inductor formed on a side surface of said second dielectric layer which is an outermost side surface of said laminated insulation layer assembly;

first electrical connection means provided through said insulation layer assembly for electrically connecting one of opposite end portions of said resonant inductor to said lower electrode; and second electrical connection means provided through said insulation layer assembly for electrically connecting the other of said opposite end portions of said resonant inductor to said upper electrode.

4. A method of setting a frequency of an LC-type dielectric filter, said LC type dielectric filter including an insulation substrate, a lower electrode formed on said insulation substrate and doubling as an earth electrode, a first dielectric layer covering substantially entirely a side surface of said insulation substrate on which said lower electrode is formed, an upper electrode formed on said first dielectric layer at a side surface area thereof standing opposite said lower electrode so that said lower electrode, said upper electrode and a portion of said first dielectric layer interposed between said lower electrode and said upper electrode cooperate with each other to constitute a resonant capacitor, and a second dielectric layer covering substantially entirely a side surface of said first dielectric layer on which said upper electrode is formed, the method comprising:

measuring a capacitance of said capacitor;

determining an optimum inductance for an inductor of said LC-type filter for providing a chosen frequency on the basis of the measured capacitance;

determining a pattern of an inductor from a plurality of predetermined patterns which differ in induction on the basis of said optimum inductance and said chosen frequency of said filter; and forming an inductor having said optimum inductance and said pattern at a predetermined inductor forming area at one side of said second dielectric layer, one of opposite ends of said inductor being electrically connected to said lower electrode, and the other of said opposite ends of said inductor being electrically connected to said upper electrode.

5. The method according to claim 4, wherein said optimum inductance for said inductor is determined by using the expression $f_0 \approx 1/\{2\pi\ (LC)^{1/2}\}$ where $f_0$ is said resonant frequency, L is said optimum inductance and C is said measured capacitance.

6. A method of producing an LC-type dielectric filter having a chosen frequency, comprising:

providing a structure including an insulation substrate, a lower electrode doubling as an earth electrode formed on said insulation substrate, a first dielectric layer formed on said lower electrode and said insulation substrate in such a manner as to cover a side surface of said insulation substrate on which said lower electrode is formed, substantially entirely, an upper electrode formed on said first dielectric layer in such a manner as to stand opposite said lower electrode, said lower electrode, said upper electrode and a portion of said first dielectric layer interposed between said lower electrode and said upper electrode cooperating with each other to constitute a resonant capacitor, a second dielectric layer formed on said upper electrode and said first dielectric layer in such a manner as to cover a side surface of said first dielectric layer on which said upper electrode is formed, substantially entirely;

measuring a capacitance of said capacitor;

determining an optimum inductance of an inductor for providing said chosen frequency on the basis of said measured capacitance;

determining a pattern of an inductor for attaining said optimum inductance; and forming an inductor having said optimum inductance and said pattern at a predetermined side surface area of said second dielectric layer.

7. A method of producing an LC-type dielectric filter having a chosen frequency, comprising:

providing a structure including an insulation substrate, a lower electrode doubling as an earth electrode formed on said insulation substrate, a first dielectric layer formed on said lower electrode and said insulation substrate in such a manner as to cover a side surface of said insulation substrate on which said lower electrode is formed, substantially entirely, an upper electrode formed on said first dielectric layer in such a manner as to stand opposite said lower electrode, said lower electrode, said upper electrode and a portion of said first dielectric layer interposed between said lower electrode and said upper electrode cooperating with each other to constitute a resonant capacitor, a second dielectric layer formed on said upper electrode and said first dielectric layer in such a manner as to cover a side surface of said first dielectric layer on which said upper electrode is formed, substantially entirely; and forming at said predetermined side surface area of said second dielectric layer an inductor having an inductance for providing said chosen frequency based on a capacitance of the capacitor.

* * * * *